United States Patent
Wang et al.

(10) Patent No.: US 10,063,253 B1
(45) Date of Patent: Aug. 28, 2018

(54) SUMMER CIRCUIT INCLUDING LINEARIZED LOAD

(71) Applicant: Intel Corporation, Santa Clara, CA (US)

(72) Inventors: Xiaoqing Wang, Santa Clara, CA (US); Shenggao Li, Pleasanton, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/629,959

(22) Filed: Jun. 22, 2017

(51) Int. Cl.
*H03M 3/00* (2006.01)
*H04L 25/03* (2006.01)
*G06G 7/14* (2006.01)
*G06G 7/186* (2006.01)

(52) U.S. Cl.
CPC .............. *H03M 3/452* (2013.01); *G06G 7/14* (2013.01); *G06G 7/1865* (2013.01); *H03M 3/424* (2013.01); *H04L 25/03006* (2013.01)

(58) Field of Classification Search
None
See application file for complete search history.

(56) References Cited

U.S. PATENT DOCUMENTS

| | | | | | |
|---|---|---|---|---|---|
| 5,124,673 | A * | 6/1992 | Hershberger | ........ | H03G 3/3068 333/18 |
| 5,999,055 | A * | 12/1999 | Kimura | ................. | H03F 3/3001 330/253 |
| 7,053,688 | B2 * | 5/2006 | Mukherjee | ........ | H04L 25/03885 327/359 |
| 8,417,752 | B1 * | 4/2013 | Chan | ........................ | H04B 3/04 708/205 |
| 8,558,613 | B2 * | 10/2013 | Acosta-Serafini | ....... | H03G 3/30 330/136 |
| 8,976,855 | B2 * | 3/2015 | Xu | ..................... | H04L 25/03057 375/232 |
| 2005/0052216 | A1 * | 3/2005 | Gaeta | ..................... | H03G 7/001 327/350 |

\* cited by examiner

*Primary Examiner* — Howard Williams
(74) *Attorney, Agent, or Firm* — Schwegman Lundberg & Woessner, P.A.

(57) ABSTRACT

Some embodiments include apparatuses having a first circuit portion, a second circuit portion, and a third circuit portion. The first circuit portion includes a first transistor to receive a first signal of a differential signal pair and a second transistor to receive a second signal of the differential signal pair. The second circuit portion is coupled to the first and second transistors and a first supply node, the second circuit portion including a first output node and a second output node to provide an output signal pair based on the differential signal pair. The third circuit portion includes a first diode-connected transistor coupled between the first output node and a second supply node and a second diode-connected transistor coupled between the second output node and the second supply node.

16 Claims, 6 Drawing Sheets

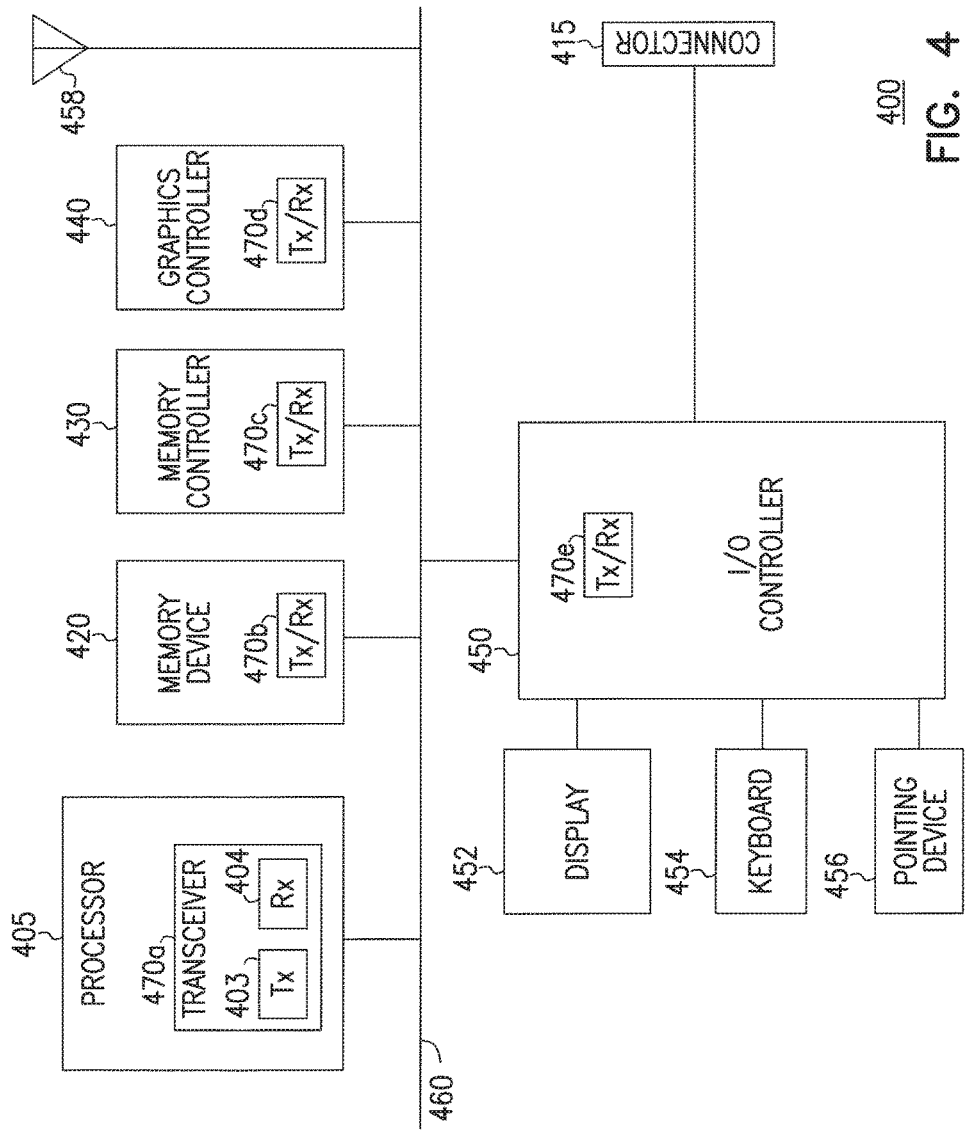

US 10,063,253 B1

SUMMER CIRCUIT INCLUDING LINEARIZED LOAD

TECHNICAL FIELD

Embodiments described herein pertain to input/output (I/O) circuitry. Some embodiments relate to summer circuits and sampler circuits in receivers.

BACKGROUND

Many electronic devices or systems, such as computers, tablets, and cellular phones, include receivers to receive signals. The signals carry information (e.g., data) transmitted from one device to another device. A receiver usually has equalizer circuitry to reduce or cancel interference (intersymbol interference) in the received signals before passing the analog signal to other circuitry in the receiver for further processing. For example, some conventional receivers have summer circuitry to improve the quality of the received analog signals, and sampler circuitry to generate digital information based on output signals from the summer circuitry. In some operations of such sampler circuitry, a charge sharing effect between adjacent circuit nodes may inject noise into the input nodes of such sampler circuitry. Such noise can degrade the quality of the signals provided at the inputs of the sampler circuitry. At a certain data rate, the noise may be uncontrollable and may lead to improper operation of the sampler circuit.

BRIEF DESCRIPTION OF THE DRAWINGS

FIG. 4 shows an apparatus in the form of an electronic system, according to some embodiments described herein

DETAILED DESCRIPTION

The technique described herein relates to a summer circuit as a part of equalization circuitry, such as a decision feedback equalization (DFE) circuitry. The summer circuit discussed herein can be a non-integrating summer circuit. Output signals (analog differential signal pair) generated by the summer circuit can be provided to a sampler circuit. The sampler circuit can operate to generate digital information that represent a digital value (e.g., logic 0 and logic 1) of the output signals from the summer circuit. The summer circuit described herein includes a circuit portion that provides linearity to the output impedance at output nodes of the summer circuit over a relatively wide range of the output signals at the output nodes. The linearity in the output impedance of the summer circuit can reduce differential "kickback" noise that may occur at the output nodes of the summer circuit. The reduction in the kickback noise leads to an improvement (e.g., increase) in the quality of the signals provided to the sampler circuit from the summer circuit. This can further improve the accuracy of signals generated by the summer circuit and the sampler circuit. Other improvements associated with the described summer circuit and sampler circuit are discussed below.

Figure 1:
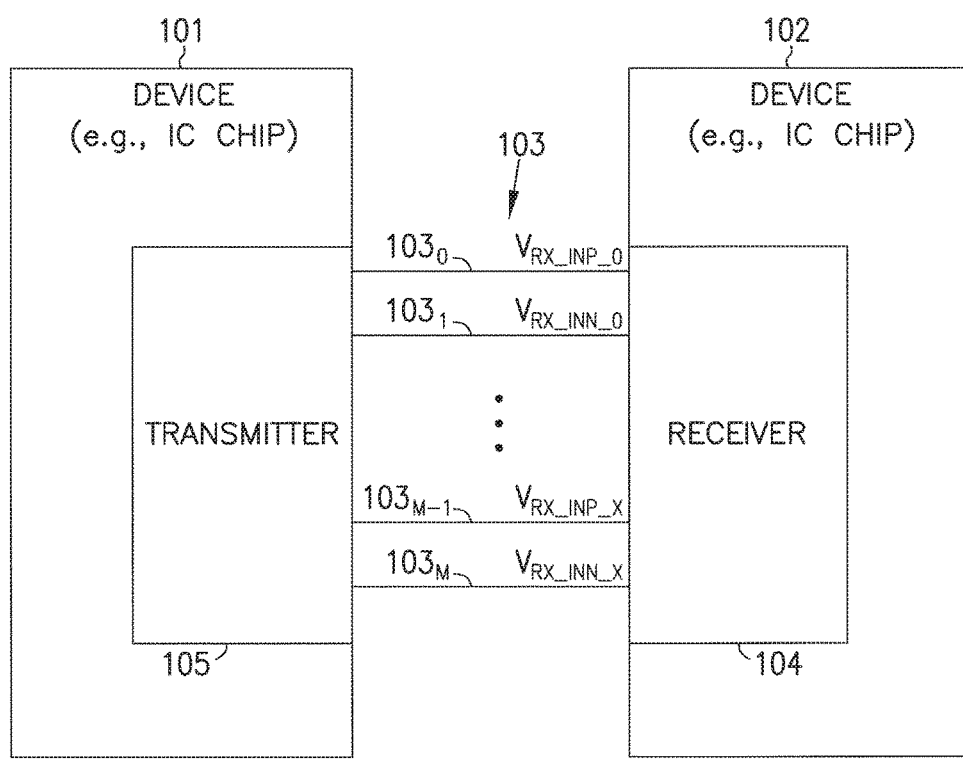
FIG. 1 shows an apparatus including devices and a channel between the devices, according to some embodiments described herein.

FIG. 1 shows an apparatus 100 including devices 101 and 102, and a channel 103 between devices 101 and 102, according to some embodiments described herein. Apparatus 100 can include or be included in an electronic device or system, such as a computer (e.g., server, desktop, laptop, or notebook), a solid state drive (SSD), a network device (e.g., Ethernet adapter, Ethernet controller, and other network devices), a tablet, a cellular phone, a wireless communication router, a digital television, an electronic wearable item (e.g., a smart watch or other wearable devices), other electronic devices or systems, and other Internet of Things (IoT) devices or systems.

In FIG. 1, each of devices 101 and 102 can include an integrated circuit (IC), such as an IC chip. Devices 101 and 102 can include a combination of a controller (e.g., processors (e.g., central processing unit (CPU)), I/O controllers, or memory controller), a memory device, and or other electronic devices. As an example, device 101 can be a memory device and device 102 can be a processor (which includes a CPU).

Devices 101 and 102 can include a transmitter 105 and a receiver 104, respectively. Channel 103 can provide communication (e.g., in the form of signal transmission) between devices 101 and 102. Channel 103 can include lanes $103_0$, $103_1$, $103_{M-1}$, and $103_M$ to conduct signals between devices 101 and 102. Lanes $103_0$, $103_1$, $103_{M-1}$, and $103_M$ can be used to carry pairs of differential signals or, alternatively, single-ended signals. Each of lanes $103_0$, $103_1$, $103_{M-1}$, and $103_M$ can include a single conductive trace (or alternatively multiple conductive traces), such as metal-based traces of a bus on a circuit board (e.g., printed circuit board of an electronic system) where devices 101 and 102 are located. In an alternative arrangement, channel 103 does not have to include conductive lines on a circuit board. For example, channel 103 can include a medium (e.g., air) for wireless communication between devices 101 and 102.

Devices 101 and 102 can communicate with each other by providing signals on lanes $103_0$, $103_1$, $103_{M-1}$, and $103_M$. As shown in FIG. 1, for example, transmitter 105 may transmit signals (e.g., data signals) $V_{RX\_INP\_0}$, $V_{RX\_INN\_0}$, $V_{RX\_INP\_X}$, and $V_{RX\_INN\_X}$ to receiver 104. These signals can carry information corresponding to bits transferred from transmitter 105. FIG. 1 shows an example where lanes $103_0$, $103_1$, $103_{M-1}$, and $103_M$ are configured to carry differential signals, such that signals $V_{RX\_INP\_0}$ and $V_{RX\_INN\_0}$ can form a differential signal pair, and signals $V_{RX\_N\_X}$ and $V_{RX\_INN\_X}$ can form another differential signal pair. However, lanes $103_0$, $103_1$, $103_{M-1}$, and $103_M$ can be configured to carry single-ended signals. FIG. 1 shows two different signal pairs transmitted from transmitter 105 to receiver 104 as an example. However, the number of different signal pairs can vary. Receiver 104 can include components and operations of the receivers described below with reference to FIG. 2 through FIG. 4.

Figure 2:
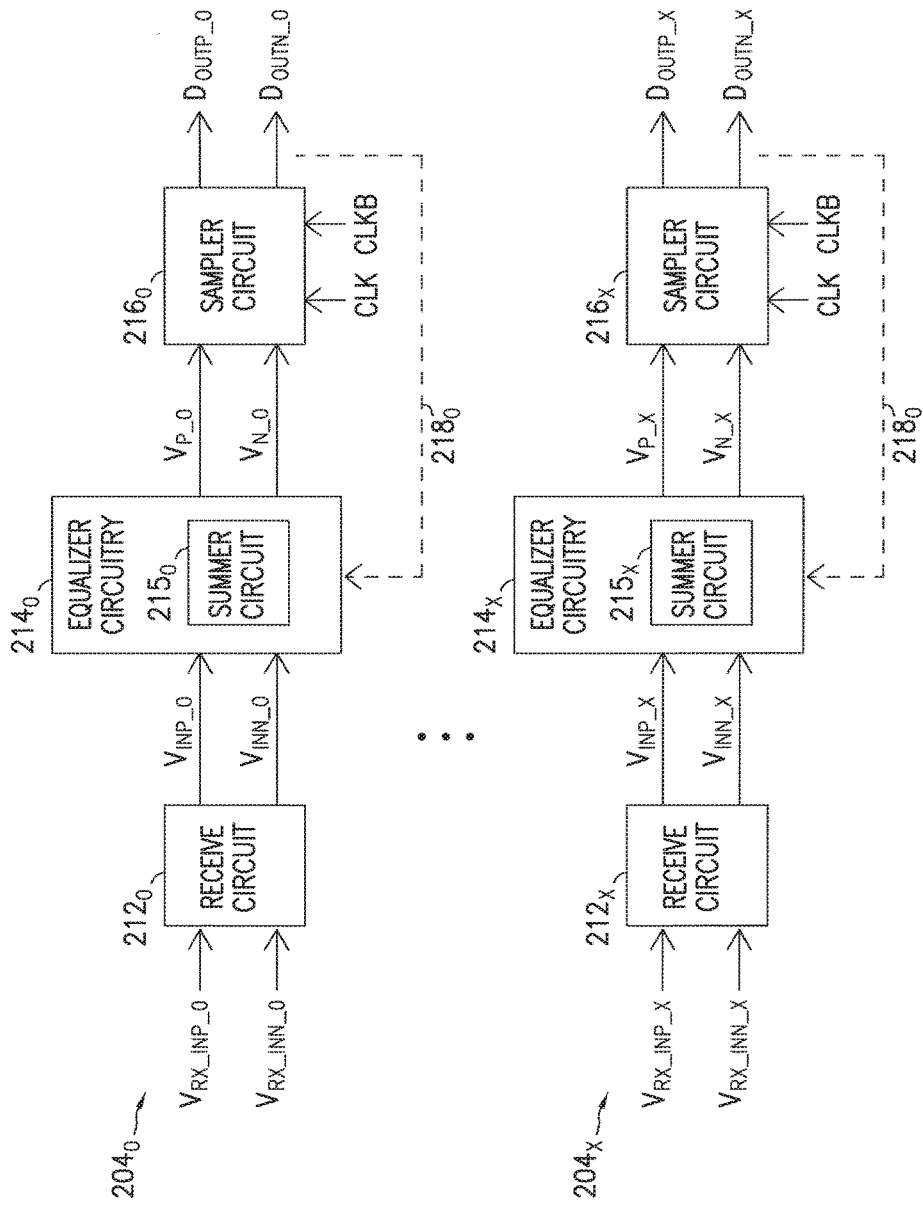
FIG. 2 shows a block diagram of a receiver including receiver lanes that include summer circuits and sampler circuits, according to some embodiments described herein.

FIG. 2 shows a block diagram of a receiver 204 including receiver lanes $204_0$ through $204_X$ that include summer circuits $215_0$ and $215_X$ and sampler circuits $216_0$ through $216_X$, according to some embodiments described herein. FIG. 2 shows an example where receiver 204 includes multiple receiver lanes $204_0$ through $204_X$. The number of receiver lanes can vary. Receiver 204 can correspond to receiver 104 of FIG. 1. Each of receiver lanes $204_0$ through $204_X$ can receive a differential signal pair and generate respective digital output information (e.g., bits of information) that has a value based on the value of a respective received differential signal pair.

For example, receiver lane $204_0$ can receive signals (e.g., analog input signals) $V_{RX\_INP\_0}$ and $V_{RX\_INN\_0}$ (e.g., a differential signal pair) and generate information $D_{OUTP\_0}$ and $D_{OUTN\_0}$ (e.g., digital output information). Receiver lane $204_X$ can receive signals $V_{RX\_INP\_X}$ and $V_{RX\_INN\_X}$ (e.g., a differential signal pair) and generate information $D_{OUTP\_X}$ and $D_{OUTN\_0}$ (e.g., digital output information). Signals $V_{RX\_INP\_0}$, $V_{RX\_INN\_0}$, $V_{RX\_INP\_X}$, and $V_{RX\_INN\_X}$ can be provided to receiver 204 by a transmitter, such as transmitter 105 of FIG. 1. In FIG. 2, each of information $D_{OUTP\_0}$, $D_{OUN\_0}$, $D_{OUTP\_X}$, and $D_{OUTN\_X}$ can be represented by a digital signal that carries bits (e.g., data bits). Information $D_{OUTP\_0}$ and $D_{OUTN\_0}$ can carry bits having complementary values (e.g., logic 0 and logic 1). Information $D_{OUTP\_X}$ and $D_{OUTN\_X}$ can carry bits having complementary values (e.g., logic 0 and logic 1). Information $D_{OUTP\_0}$, $D_{OUN\_0}$, $D_{OUTP\_X}$, and $D_{OUTN\_X}$ can be provided to other components (not shown) coupled to receive lanes $204_0$ and $204_X$ for further processing.

As shown in FIG. 2, receiver lane $204_0$ can include a receive circuit $212_0$, an equalizer circuitry $214_0$, a sampler circuit $216_0$, and a path (e.g., feedback path) $218_0$. Receive circuit $212_0$ can include a linear equalizer (e.g., a continuous time linear equalizer (CTLE)). Receive circuit $212_0$ can perform an equalization operation (e.g., a CTLE operation) to equalize (e.g., reduce noise in) signals $V_{RX\_INP\_0}$ and $V_{RX\_INN\_0}$ and generate signals $V_{INP\_0}$ and $V_{INN\_0}$ (e.g., a differential signal pair).

Equalizer circuitry $214_0$ can include a DFE. Equalizer circuitry $214_0$ can perform an equalization operation (e.g., DFE operation) on signals $V_{INP\_0}$ and $V_{RX\_INP\_0}$ and generate signals $V_{INP\_0}$ and $V_{INN\_0}$ (e.g., equalized output different signal pair)).

Sampler circuit $216_0$ can receive signals $V_{INP\_0}$ and $V_{INN\_0}$ and generate information $D_{OUTP\_0}$ and $D_{OUTN\_0}$ based on signals $V_{P\_0}$ and $V_{N\_0}$. Sampler circuit $216_0$ can be used as a data sampler circuit (or as an error sampler circuit). Sampler circuit $216_0$ can receive clock signals (e.g., complementary clock signals) CLK and CLKB and sample signals $V_{P\_0}$ and $V_{N\_0}$ (to generate information $D_{OUTP\_0}$ and $D_{OUTN\_0}$) based on timing (e.g., phases) of clock signals CLK and CLKB.

As shown in FIG. 2, equalizer circuitry $214_0$ can include a summer circuit $215_0$. Equalizer circuitry $214_0$ may use one or both of information $D_{OUTP\_0}$ and $D_{OUTN\_0}$ (from path $218_0$) as part of the equalization operation (e.g., DFE operation). For example, summer circuit $215_0$ can operate to generate signals $V_{INP\_0}$ and $V_{N\_0}$ based on the value of information on signal signals $V_{INP\_0}$ and $V_{INN\_0}$ AND the values of information on path $218_0$.

In a similar arrangement, receiver lane $204_X$ can include a receive circuit $212_X$, an equalizer circuitry $214_X$ (which can include a summer circuit $215_X$), sampler circuit $216_X$, and a path $218_X$. Like receiver lane $204_0$, receiver lane $204_X$ can operate to receive signals $V_{RX\_INP\_X}$ and $V_{RX\_INN\_X}$ and generate signals $V_{INP\_X}$ and $V_{INN\_X}$, signals $V_{P\_X}$ and $V_{N\_X}$, and information $D_{OUTP\_X}$ and $D_{OUTN\_X}$.

Each of summer circuits $215_0$ and $215_X$ can include components and operations of the summer circuits described below with reference to FIG. 3A through FIG. 4. Each of sampler circuits $216_0$ and $216_X$ can include components and operations of the sampler circuit circuits described below with reference to FIG. 3A through FIG. 4.

Figure 3A:
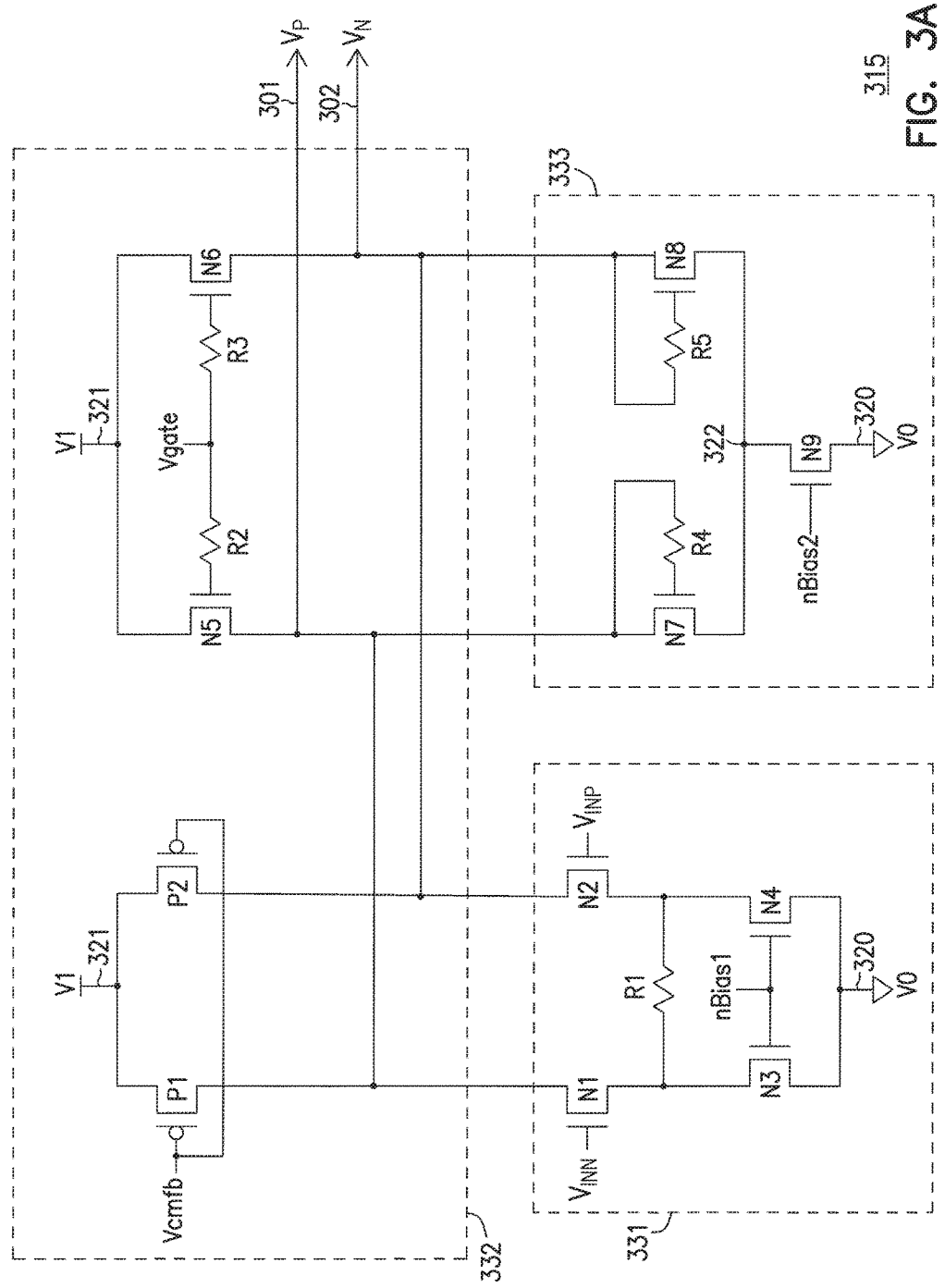
FIG. 3A shows a schematic diagram of a summer circuit, according to some embodiments described herein.

FIG. 3A shows a schematic diagram of a summer circuit 315, according to some embodiments described herein. Summer circuit 315 can be a non-integrating summer circuit. Summer circuit 315 can be summer circuit $215_0$ or $215_X$ of receiver 204 of FIG. 2. As shown in FIG. 3A, summer circuit 315 can receive signals $V_{INP}$ and $V_{INN}$ (e.g., a differential signal pair) and generate signals $V_P$ and $V_N$ at nodes (output nodes) 301 and 302, respectively. Signals $V_{INP}$ and $V_{INN}$ can correspond to signals $V_{INN\_0}$ and $V_{INN\_0}$ or signals $V_{INP\_X}$ and $V_{INN\_X}$ of FIG. 2. Signals $V_P$ and $V_N$ can correspond to signals $V_{P\_0}$ and $V_{N\_0}$ or signals $V_{P\_X}$ and $V_{N\_X}$ of FIG. 2.

As shown in FIG. 3A, summer circuit 315 can include supply nodes 320 and 321 to receive voltages V0 and V1, respectively. Voltage V1 (e.g., a positive voltage) can include a supply voltage (e.g., Vcc) of summer circuit 315. Supply node 320 can be coupled to a ground connection (e.g., Vss) such that voltage V0 can have a value of zero volts.

Signals $V_{INP}$ and $V_{INN}$ can have different voltages and can swing within a range (not shown) that is less than the range between V0 and V1. For example, signals $V_{INP}$ and $V_{INN}$ can swing within a range between V2 and V3 (not shown) in which each of voltages V2 can V3 can be greater than voltage V0 (e.g., zero volts) and less than voltage V1 (e.g., Vcc). Signals $V_P$ and $V_N$ can have different voltages and can swing within a range (not shown) that is less than the range between V0 and V1. For example, signals $V_P$ and $V_N$ can swing within a range between voltage V3 and V4 (not shown) in which each of voltages V3 and V4 can be greater than voltage V0 and less than voltage V1. The signal swing of signals $V_P$ and $V_N$ can be greater than the signal swing of signals $V_{INP}$ and $V_{INN}$.

As shown in FIG. 3A, summer circuit 315 can include a circuit portion 331 that includes transistors N1, N2, N3, and N4, and a resistor R1; a circuit portion 332 that includes transistors P1, P2, N5, and N6, and resistors R2 and R3; and a circuit portion 333 that includes transistors N7, N8, and N9, and resistors R4 and R5. Each of transistors P1 and P2 can include a field effect transistor (FET), such as a p-channel metal-oxide semiconductor (PMOS) transistor. Each of transistors N1 through N9 can include an n-channel metal-oxide semiconductor (NMOS) transistor.

Circuit portion 331 can operate to receive signals $V_{INP}$ and $V_{INN}$ at the gates of transistors N2 and N1, respectively. Transistors N3 and N4 can include gates coupled to each other to receive a signal (e.g., bias signal) nBias1, and sources coupled to supply node 320. Resistor R1 can be coupled between the drains of transistors N3 and N4. Transistors N1 and N2 can include drains coupled to nodes 301 and 302, respectively.

In circuit portion 332, transistors P1 and P2 can include gates coupled to each other to receive a signal Vcmfb, and sources coupled to supply node 321. Transistors P1 and P2 can include drains coupled to nodes 301 and 302, respectively. Transistors N5 and N6 can include gates coupled to respective resistors R2 and R3 and can receive a signal Vgate through resistors R2 and R3, respectively. Transistors N5 and N6 can include drains coupled to supply node 321 and sources coupled to respective nodes 301 and 302.

In circuit portion 333, transistor N7 can be coupled as a diode-connected transistor between node 301 and supply node 320 (through transistor N9). Transistor N8 can be coupled as a diode-connected transistor between node 302 and supply node 320 (through transistor N9). Transistors N7 and N8 can have sources coupled to a node 322. Transistor N9 can be coupled between node 322 and supply node 320. Transistor N9 can have a gate to receive a signal (e.g., bias signal) nBias2.

As shown in FIG. 3A, the gate of transistor N7 (diode-connected transistor) can be coupled to the drain of transistor N7 through resistor R4, and the gate of transistor N8 (diode-connected transistor) can be coupled to the drain of transistor N8 through resistor R5. Resistors R4 and R5 are included in the circuit portion to improve the bandwidth of summer circuit 315. However, in an alternative structure of summer circuit 315, resistors R4 and R5 can be omitted from circuit portion 333. For example, resistors R4 and R5 may be omitted from circuit portion 333 if the bandwidth of summer circuit 315 can be at an acceptable range without resistors R4 and R5. In the alternative structure of summer circuit 315 (without resistors R4 and R5), the gate of diode-connected transistor N7 can be coupled directly to the drain of transistor N7, and the gate of diode-connected transistor N8 can be coupled directly to the drain of transistor N8.

Summer circuit 315 can include other components (e.g., offset circuitry and capacitors) coupled to nodes 301 and 302. However, for simplicity, the other components of summer circuit 315 are omitted from FIG. 3A.

Circuit portion 331 can operate as an input portion to receive signals $V_{INP\_0}$ and $V_{INN\_0}$. Circuit portion 332 can operate as a load (e.g., output load). Circuit portion 333 can operate in conjunction with circuit portion 332 to reduce kickback noise that may occur at nodes 301 and 302 to improve the operation of summer circuit 315 and the operation of a sampler circuit (FIG. 3B) coupled to nodes 301 and 302. Signals Vcmfb can be provided with voltages to control (e.g., turn on and turn off) transistors P1 and P2 during different stages (e.g., input stage and amplifying stage) of summer circuit 315. Signals Vgate, nBias1, and nBias2 can be provided with voltages to control (e.g., turn on) respective transistors N3, N4, and N9.

Transistors N1 and N2 can receive signals (e.g., differential signal pair) $V_{INP}$ and $V_{INN}$ that can have different values at different times, depending on the value of information carried by signals $V_{INP}$ and $V_{INN}$. Summer circuit 315 can generate signals (e.g., differential signal pair) $V_P$ and $V_N$ having the values based on the values of signals $V_{INP}$ and $V_{INN}$. As described below, signals $V_P$ and $V_N$ at nodes 301 and 302 of summer circuit 315 can be provided to a sampler circuit (e.g., shown in FIG. 3B). The sampler circuit may have kickback noise injected to nodes 301 and 302 during operation of the sampler circuit. Summer circuit 315 can operate to reduce such kickback noise at nodes 301 and 302, as described below with reference to FIG. 3A, FIG. 3B, and FIG. 3C.

Figure 3B:
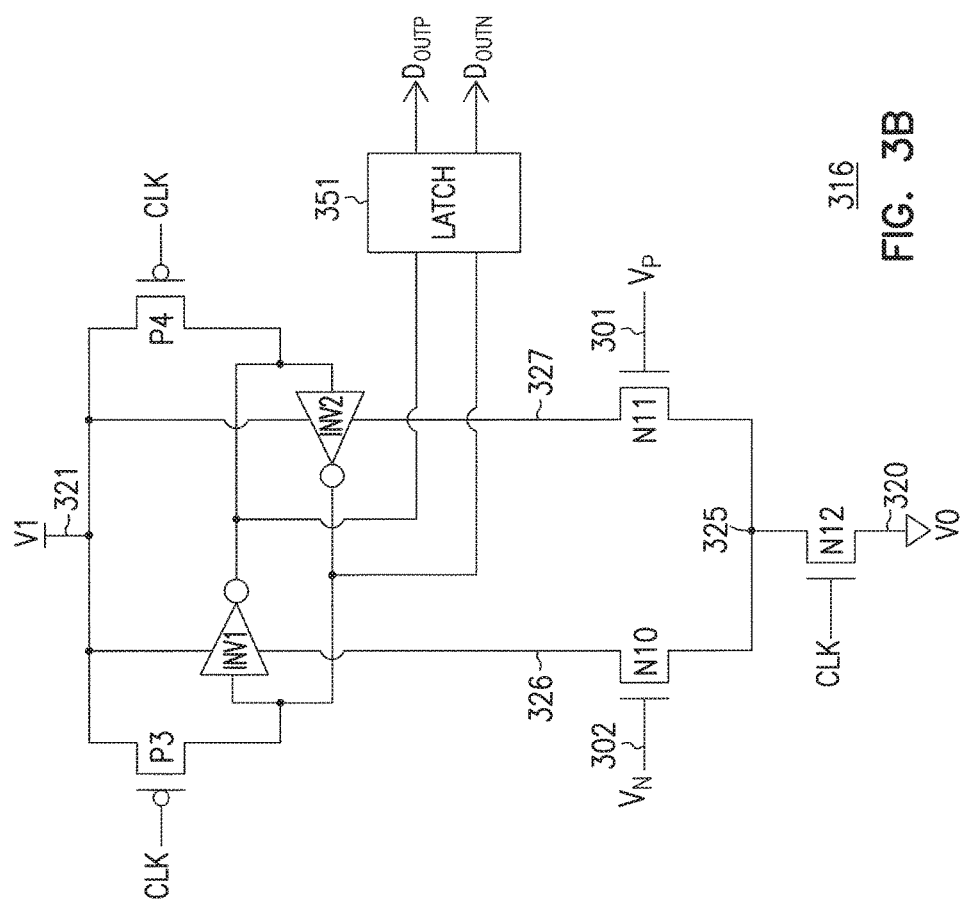
FIG. 3B shows a sampler circuit that can be used with the summer circuit of FIG. 3A, according to some embodiments described herein.

FIG. 3B shows a sampler circuit 316 that can be used with summer circuit 315 of FIG. 3A, according to some embodiments of the invention. As shown in FIG. 3B, sampler circuit 316 can receive voltages V0 and V1 at respective supply nodes 320 and 321, clock signals CLK, and signals $V_P$ and $V_N$ (from nodes 301 and 302 of summer circuit 315 of FIG. 3A), and generate information (digital output information) $D_{OUTP}$ and $D_{OUTN}$. Sampler circuit 316 can include inverters INV1 and INV2, which can be complementary metal-oxide semiconductor (CMOS), transistors N10, N11, N12, P3, and P4, and a latch 351. As shown in FIG. 3B, nodes 301 and 302 (which are output nodes of summer circuit 315 of FIG. 3A) can be input nodes of sampler circuit 316.

During operation of sampler circuit 316, charge sharing can occur between node 301 and node 325, and between node 302 and node 325 when clock signal CLK switches between different levels (e.g., switches from a lower level to a higher level). This charge sharing can inject current into node 301 and node 302. Charge sharing can also occur between node 301 and node 327, and between node 302 and node 326 when clock signal CLK switches between different levels (e.g., switches from a higher level to a lower level). This charge sharing can also inject current into node 301 and node 302. The charge injections during transitions of clock signal CLK cause kickback noise to occur at nodes 301 and 302.

Sampler circuit 316 may include components (not shown) to mitigate the kickback noise. However, some kickback noise may remain at nodes 301 and 302. Although the current from the kickback noise seen by nodes 301 and 302 may be equal, the differential outputs (e.g., signals $V_P$ and $V_N$) of summer circuit 315 may have a differential kickback noise if the output impedance at nodes 301 and 302 of summer circuit 315 are imbalanced (e.g., are not substantially equal). Such a differential kickback noise (at nodes 301 and 302) can cause distortion in the waveforms (e.g., data eye) of $V_P$ and $V_N$ (at nodes 301 and 302), thereby affecting the quality of signals at the output of inverters INV1 and INV2 (which are based on signals $V_P$ and $V_N$). At a certain data rate (e.g., a data rate in the gigabits-per-second range), the differential kickback noise can be significant and may affect the operations of sampler circuit 316 because such a data rate may not provide enough time for the kickback noise to settle and allow proper operation of sampler circuit 316.

Summer circuit 315 (FIG. 3A) includes a circuit portion (e.g., circuit portion 333) that can balance (e.g., linearize) the output impedance at nodes 301 and 302 to further reduce kickback noise at nodes 301 and 302 during operation of sampler circuit 316. This can improve the quality (e.g., improve symmetry in the data eye) of signals $V_P$ and $V_N$, leading to an improvement in the accuracy of the value of information $D_{OUTP}$ and $D_{OUTN}$ generated by sampler circuit 316.

Figure 3C:
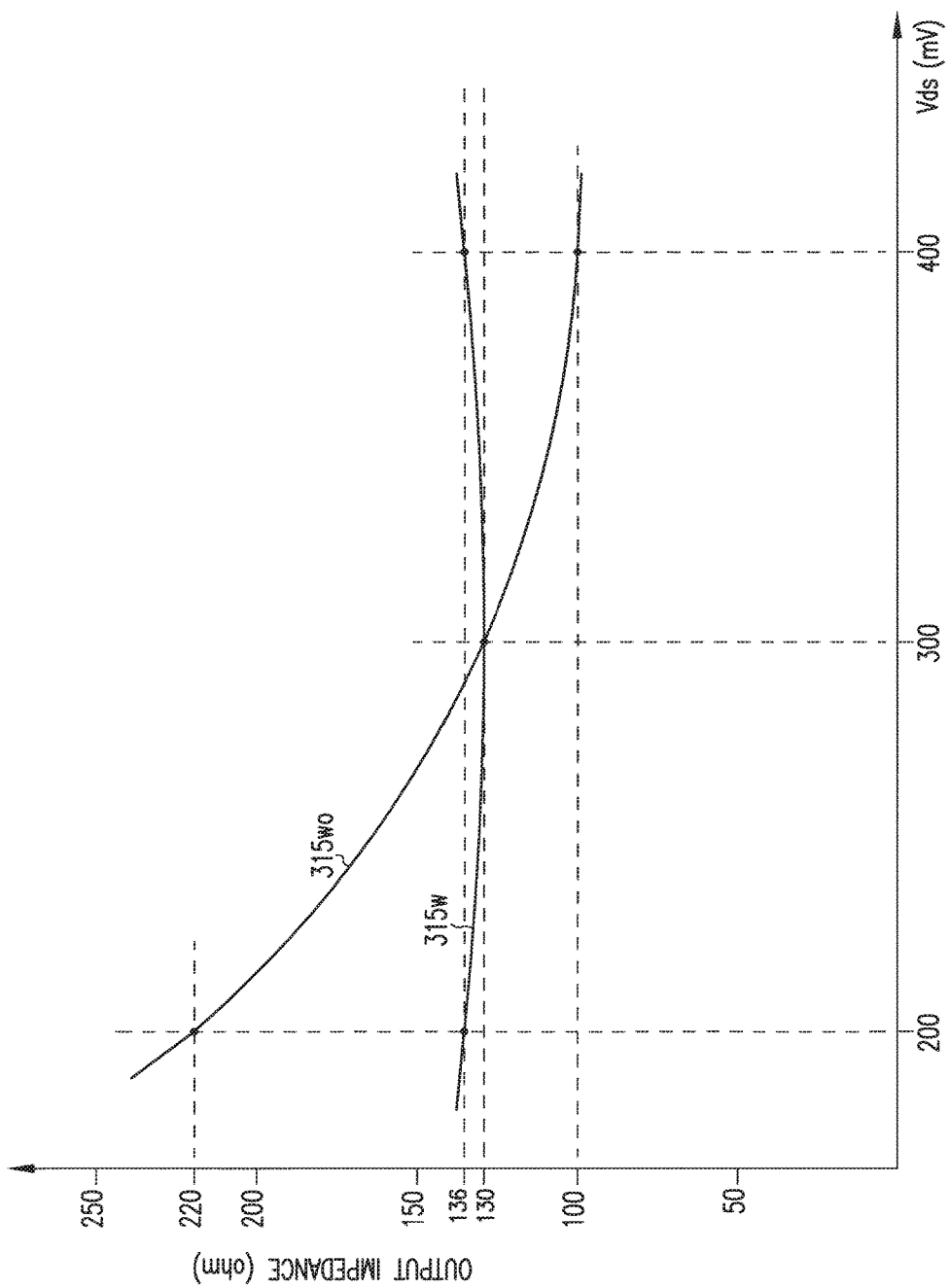
FIG. 3C is a graph showing example relationships between an output impedance and an output voltage of the summer circuit of FIG. 3A with and without the inclusion of a circuit portion in the summer circuit of FIG. 3A, according to some embodiments described herein.

FIG. 3C is a graph showing example relationships between an output impedance and an output voltage of summer circuit 315 of FIG. 3A with and without the inclusion of circuit portion 333, according to some embodiment described herein. In FIG. 3C, the vertical axis shows an example output impedance (in ohm unit) at node 301 (or node 302), and the horizontal axis shows voltage Vds (in millivolt unit). Voltage Vds is a voltage difference between the drain and the source of transistor N5 (or N6). Voltage Vds can be the difference in voltage between V1 (e.g., Vcc) and the voltage at node 301 or 302. The output impedance values and the voltage values shown in FIG. 3C are example values (e.g., based on simulation results). However, output impedance values and the voltage values in a particular summer circuit can be different from the values shown in FIG. 3C.

In FIG. 3C, curve 315w represents the relationship between the output impedance and the output voltage at node 301 of summer circuit 315 with the inclusion of circuit portion 333 (as shown in FIG. 3A), and curve 315wo represents the relationship between the output impedance and the output voltage at node 301 of summer circuit 315 without the inclusion of circuit portion 333 (e.g., circuit portion is removed from summer circuit 315). The relationships (not shown in FIG. 3C) between the output impedance and the output voltage at node 302 (with and without circuit portion 333) can be similar to that of node 301 shown in FIG. 3C. Thus, for simplicity, the curves 315w and 315wo can be used to represent the output impedance of summer circuit 315

As shown in FIG. 3C, curve 315wo shows that the output impedance of summer circuit 315 can vary between 220 ohms (e.g., at Vds=200 mV) and 100 ohms (e.g., at Vds=400 mV). In this example, signal $V_P$ can swing between 200 mV and 400 mV (e.g., +/−200 mV differential output level). Thus, without the inclusion of circuit portion 333 in summer circuit 315, the variation of about 220% (between 100 ohms and 200 ohms) in the output impedance over the range of the signal swing of signal $V_P$ causes the output impedance of summer circuit 315 (without the inclusion of circuit portion 333) to be non-linear. This non-linearity can convert common-mode kickback noise into differential kickback noise at nodes 301 and 302. This can affect (e.g., reduce) the quality of signals at the output of inverters INV1 and INV2 (which are based on signals $V_P$ and $V_N$). Thus, the accuracy of information $D_{OUTP}$ and $D_{OUTN}$ (which are based on signals $V_P$ and $V_N$) may suffer.

As shown in FIG. 3C, curve 315w shows that the output impedance of summer circuit 315 can vary between 130 ohms (e.g., at Vds=300 mV) and 136 ohms (e.g., at Vds=200 mV or 400 mV). In this example, signal $V_P$ can swing between 200 mV and 400 mV (e.g., +/−200 mV differential output level). Thus, with the inclusion of circuit portion 333 in summer circuit 315, the variation in the output impedance is about 5% (e.g., between 130 ohms and 136 ohms) over the range of the signal swing of signal $V_P$. A variation of about 5% in output impedance is relatively constant. Thus, inclusion of circuit portion 333 can linearize the output impedance at nodes 301 and 302. This means that the load at node 301 and 302 of summer circuit 315 can be viewed as a linearized load. This linearity can reduce kickback noise at nodes 301 and 302.

The reduction in impedance variations can be attributed to transistors (diode-connected transistors) N7 and N8 of circuit portion 333. For example, in comparison with transistors N5 and N6, transistors N7 and N8 can have a similar output impedance dependency on voltage levels, but in the opposite direction. Thus, the impedance variation on each of nodes 301 and 302 can be greatly reduced for a relatively wide output dynamic range. As described above, a reduction from 220%° variation (without the presence of circuit portion 333) to 5% variation can be seen at nodes 301 and 302 when circuit portion 333 is included in summer circuit 315. This reduction in the impedance variation can result in a much lower differential kickback noise given the same common-mode kickback noise.

Further, transistors N7 and N8 of circuit portion 333 can have the same type (e.g., NMOS transistors) and can have the same size as transistors N5 and N6, respectively. This can avoid mismatch (e.g., process skew-related mismatch) between transistor pair N5/N6 and transistor pair N7/N8.

As mentioned above, resistors R4 and R5 may be omitted from circuit portion 333 in some situations. However, to further match the frequency-domain response of resistors R2 and R3 (which can have the same resistance value) and transistors N5 and N6 (which can have the same size) of circuit portion 332, resistors R4 and R5 can be included in circuit portion 333 to enable a similar active-inductor peaking scheme (similar to that of resistors R2 and R3) while boosting the bandwidth of summer circuit 315. In FIG. 3A, resistance values of transistors R4 and R5 can be equal to resistance values of transistors R2 and R3, respectively.

Thus, as described above, circuit portion 333 can operate to linearize the load of summer circuit 315 across a relatively wide output dynamic range. This can lead to a better matched output impedance at nodes 301 and 302, thereby reducing differential kickback noise at sampler circuit 316 without adding significant capacitive loading to summer circuit 315.

FIG. 4 shows an apparatus in the form of a system (e.g., electronic system) 400, according to some embodiments described herein. System 400 can include or be included in a computer, a tablet, or other electronic system. As shown in FIG. 4, system 400 can include components, such as a processor 405, a memory device 420, a memory controller 430, a graphics controller 440, an I/O controller 450, a display 452, a keyboard 454, a pointing device 456, at least one antenna 458, a connector 415, and a bus 460. Bus 460 can include conductive lines (e.g., metal-based traces on a circuit board where the components of system 400 are located).

In some arrangements, system 400 does not have to include a display. Thus, display 452 can be omitted from system 400. In some arrangements, system 400 does not have to include any antenna 458. Thus, antenna 458 can be omitted from system 400.

Processor 405 can include a general-purpose processor or an application specific integrated circuit (ASIC). Processor 405 can include a CPU.

Memory device 420 can include a dynamic random access memory (DRAM) device, a static random access memory (SRAM) device, a flash memory device, phase change memory, a combination of these memory devices, or other types of memory. FIG. 4 shows an example where memory device 420 is a stand-alone memory device separated from processor 405. In an alternative arrangement, memory device 420 and processor 405 can be located on the same die. In such an alternative arrangement, memory device 420 is an embedded memory in processor 405, such as embedded DRAM (eDRAM), embedded SRAM (eSRAM), embedded flash memory, or another type of embedded memory.

Display 452 can include a liquid crystal display (LCD), a touchscreen (e.g., capacitive or resistive touchscreen), or another type of display. Pointing device 456 can include a mouse, a stylus, or another type of pointing device.

I/O controller 450 can include a communication module for wired or wireless communication (e.g., communication through one or more antenna 458). Such wireless communication may include communication in accordance with WiFi communication technique, Long Term Evolution Advanced (LTE-A) communication technique, or other communication techniques.

I/O controller 450 can also include a module to allow system 400 to communicate with other devices or systems in accordance with to one or more of the following standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), Ethernet, and other specifications.

Connector 415 can be arranged (e.g., can include terminals, such as pins) to allow system 400 to be coupled to an external device (or system). This may allow system 400 to communicate (e.g., exchange information) with such a device (or system) through connector 415.

Connector 415 and at least a portion of bus 460 can include conductive lines that conform with at least one of USB, DP, HDMI, Thunderbolt, PCIe, Ethernet, and other specifications.

As shown in FIG. 4, processor 405 can include a transceiver (Tx/Rx) 470a having a transmitter (Tx) 403 and a receiver (Rx) 404. Transmitter 403 can operate to transmit information from processor 405 to another part of system 400 or to an external device (or system) coupled to connector 415. Receiver 404 of processor 405 can operate to receive information from another part of system 400 or from an external device (or system) coupled to connector 415. For example, receiver 404 can receive information (e.g., data signals) from one or more of memory device 420, memory controller 430, graphics controller 440, and I/O controller 450. Receiver 404 can include components and operation of any of the receivers and summer circuits described above with reference to FIG. 1 through FIG. 3C. For example, receiver 404 can include summer circuits (e.g., summer circuits $215_0$, $215_X$, and 315) and sampler circuits (e.g., sampler circuits $216_0$, $216_X$, and 316) described above with reference to FIG. 2 through FIG. 3C.

As shown in FIG. 4, memory device 420, memory controller 430, graphics controller 440, and I/O controller 450 can include transceivers 470b, 470c, 470d, and 470e, respectively, to allow each of these components to transmit and receive information through their respective transceiver. At least one of transceivers 470b, 470c, 470d, and 470e can be similar to or identical to transceiver 470a. Thus, at least one of transceivers 470b, 470c, 470d, and 470e can include a receiver similar to or identical to receiver 404. For example, at least one of transceivers 470b, 470c, 470d, and 470e can include a receiver that can be arranged to allow at least one of memory device 420, memory controller 430, graphics controller 440, and I/O controller 450 to receive information (e.g., data and clock signals) from another part of system 400 or from an external device (or system) coupled to connector 415.

FIG. 4 shows the components of system 400 arranged separately from each other as an example. For example, each of processor 405, memory device 420, memory controller 430, graphics controller 440, and I/O controller 450 can be located on a separate IC (e.g., semiconductor die or an IC chip). In some arrangements, two or more components (e.g., processor 405, memory device 420, graphics controller 440, and I/O controller 450) of system 400 can be located on the same die (e.g., same IC chip) that forms a system-on-chip (SoC).

The illustrations of the apparatuses (e.g., apparatus 100 and system 400 including receivers, summer circuits, and sampler circuits included in the receivers) described above are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single-processor module or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

ADDITIONAL NOTES AND EXAMPLES

Example 1 includes subject matter (such as a device, an electronic apparatus (e.g., circuit, electronic system, or both), or a machine) including a first circuit portion including a first transistor to receive a first signal of a differential signal pair, and a second transistor to receive a second signal of the differential signal pair, a second circuit portion coupled to the first and second transistors and a first supply node, the second circuit portion including a first output node and a second output node to provide an output signal pair based on the differential signal pair, and a third circuit portion including a first diode-connected transistor coupled between the first output node and a second supply node, and a second diode-connected transistor coupled between the second output node and the second supply node.

In Example 2, the subject matter of Example 1 may optionally include, wherein the first diode-connected transistor includes a gate and a drain, and the gate of the first transistor is coupled to the drain of the first transistor through a first resistor, and the second diode-connected transistor includes a gate and a drain, and the gate of the second transistor is coupled to the drain of the second transistor through a second resistor.

In Example 3, the subject matter of Example 1 may optionally include, wherein the first diode-connected transistor includes a gate and a drain, and the gate of the first transistor is directly coupled to the drain of the first transistor, and the second diode-connected transistor includes a gate and a drain, and the gate of the second transistor is directly coupled to the drain of the second transistor.

In Example 4, the subject matter of any of Examples 1-3 may optionally include, wherein each of the first and second diode-connected transistors includes a source coupled to a node, and the third circuit portion includes a transistor coupled between the node and the second supply node.

In Example 5, the subject matter of any of Examples 1-3 may optionally include, wherein the first circuit portion includes a third transistor coupled between the first transistor and the second supply node, and a fourth transistor coupled between the second transistor and the second supply node.

In Example 6, the subject matter of Example 5 may optionally include, wherein the first circuit portion includes a resistor coupled between a drain of the third transistor and a drain of the fourth transistor.

In Example 7, the subject matter of Example 5 may optionally include, wherein the third transistor includes a gate coupled to a gate of the fourth transistor.

In Example 8, the subject matter of any of Examples 1-3 may optionally include, wherein the second circuit portion includes a third transistor coupled between the first supply node and the first transistor, and a fourth transistor coupled between the first supply node and the second transistor.

In Example 9, the subject matter of Example 8 may optionally include, wherein the second circuit portion includes a fifth transistor coupled between the first supply node and the first output node, and a sixth transistor coupled between the first supply node and the second output node.

In Example 10, the subject matter of Example 9 may optionally include, wherein the second circuit portion includes a first resistor coupled between a gate of the fifth transistor and a node, and a second resistor coupled between a gate of the sixth transistor and the node.

Example 11 includes subject matter (such as a device, an electronic apparatus (e.g., circuit, electronic system, or both), or a machine) including a first circuit included in an equalizer circuitry and to receive a first differential signal pair and generate a second differential signal pair based on the first differential signal pair, the first circuit including a first circuit portion including a first transistor to receive a first signal of the second differential signal pair, and a second transistor to receive a second signal of the second differential signal pair, a second circuit portion including a third transistor coupled between a first supply node and a first output node to provide a first signal of the second differential pair, and a fourth transistor coupled between the first supply node and a second output node to provide a second signal of the second differential pair, a third circuit portion including a first diode-connected transistor coupled between the first output node and a second supply node, and a second diode-connected transistor coupled between the second output node and the second supply node, and a second circuit including a pair of transistors having gates to receive the second differential signal pairs from the output nodes of the first circuit, and to generate digital information based on the second differential signal pairs.

In Example 12, the subject matter of Example 11 may optionally include, wherein the equalizer circuitry is a decision feedback equalizer circuitry.

In Example 13, the subject matter of Example 12 may optionally include, wherein the first circuit includes a summer circuit of the decision feedback equalizer circuitry, and the second circuit includes a sampler circuit.

In Example 14, the subject matter of any of Examples 11-13 may optionally include, wherein the first transistor includes a drain coupled to a source of the third transistor and the first output node, and the second transistor includes a drain coupled to a source of the fourth transistor and the second output node.

In Example 15, the subject matter of Example 14 may optionally include, wherein the first and second diode-connected transistors and the third and fourth transistors have a same transistor type In Example 16, the subject matter of Example 15 may optionally include, wherein each of the first and second diode-connected transistors, and the third and fourth transistors has a gate coupled to a resistor.

In Example 17, the subject matter of Example 15 may optionally include, wherein the transistor type is an n-channel metal-oxide semiconductor (NMOS) transistor type.

Example 18 includes subject matter (such as a device, an electronic apparatus (e.g., circuit, electronic system, or both), or a machine) including conductive lines on a circuit board, a device located on the circuit board and coupled to the conductive lines, and a processor located on the circuit board and including a receiver coupled to the conductive lines, the receiver including a circuit, the circuit including a first circuit portion including a first transistor to receive a first signal of a differential signal pair provided by the device, and a second transistor to receive a second signal of the differential signal pair, a second circuit portion coupled to the first and second transistors and a first supply node, the second circuit portion including a first output node and a second output node to provide an output signal pair based on the differential signal pair, and a third circuit portion including a first diode-connected transistor coupled between the first output node and a second supply node, and a second diode-connected transistor coupled between the second output node and the second supply node.

In Example 19, the subject matter of Example 18 may optionally include, wherein the receiver includes a decision feedback equalizer, and the circuit is included in the decision feedback equalizer.

In Example 20, the subject matter of Example 18 or 19 may optionally include, further comprising a connector coupled to the processor, the connector conforming with one of Universal Serial Bus (USB), High-Definition Multimedia Interface (HDMI), Thunderbolt, Peripheral Component Interconnect Express (PCIe), and Ethernet specifications.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
 a first circuit portion including a first transistor to receive a first signal of a differential signal pair, and a second transistor to receive a second signal of the differential signal pair;
 a second circuit portion coupled to the first and second transistors and a first supply node, the second circuit portion including a first output node and a second output node to provide an output signal pair based on the differential signal pair, wherein the second circuit portion includes:
  a first additional transistor coupled between the first supply node and the first output node, the first additional transistor including a gate;
  a second additional transistor coupled between the first supply node and the second output node, the second additional transistor including a gate coupled to the gate of the first additional transistor; and
 a third circuit portion including a first diode-connected transistor coupled between the first output node and a second supply node, and a second diode-connected transistor coupled between the second output node and the second supply node.

2. The apparatus of claim 1, wherein:
 the first diode-connected transistor includes a gate and a drain, and the gate of the first transistor is coupled to the drain of the first transistor through a first resistor; and
 the second diode-connected transistor includes a gate and a drain, and the gate of the second transistor is coupled to the drain of the second transistor through a second resistor.

3. The apparatus of claim 2, wherein each of the first and second diode-connected transistors includes a source coupled to a node, and the third circuit portion includes a transistor coupled between the node and the second supply node.

4. The apparatus of claim 1, wherein:
the first diode-connected transistor includes a gate and a drain, and the gate of the first transistor is directly coupled to the drain of the first transistor; and
the second diode-connected transistor includes a gate and a drain, and the gate of the second transistor is directly coupled to the drain of the second transistor.

5. The apparatus of claim 1, wherein the first circuit portion includes:
a third transistor coupled between the first transistor and the second supply node; and
a fourth transistor coupled between the second transistor and the second supply node.

6. The apparatus of claim 5, wherein the first circuit portion includes a resistor coupled between a drain of the third transistor and a drain of the fourth transistor.

7. The apparatus of claim 5, wherein the third transistor includes a gate coupled to a gate of the fourth transistor.

8. An apparatus comprising:
a first circuit portion including a first transistor to receive a first signal of a differential signal pair, and a second transistor to receive a second signal of the differential signal pair;
a second circuit portion coupled to the first and second transistors and a first supply node, the second circuit portion including a first output node and a second output node to provide an output signal pair based on the differential signal pair, wherein the second circuit portion includes:
a third transistor coupled between the first supply node and the first transistor;
a fourth transistor coupled between the first supply node and the second transistor;
a fifth transistor coupled between the first supply node and the first output node;
a sixth transistor coupled between the first supply node and the second output node;
a first resistor coupled between a gate of the fifth transistor and a node; and
a second resistor coupled between a gate of the sixth transistor and the node; and
a third circuit portion including a first diode-connected transistor coupled between the first output node and a second supply node, and a second diode-connected transistor coupled between the second output node and the second supply node.

9. An apparatus comprising:
a first circuit included in an equalizer circuitry and to receive a first differential signal pair and generate a second differential signal pair based on the first differential signal pair, the first circuit including:
a first circuit portion including a first transistor to receive a first signal of the second differential signal pair, and a second transistor to receive a second signal of the second differential signal pair;
a second circuit portion including a third transistor coupled between a first supply node and a first output node to provide a first signal of the second differential pair, and a fourth transistor coupled between the first supply node and a second output node to provide a second signal of the second differential pair, the third transistor including a gate, and the fourth transistor including a gate coupled to the gate of the third transistor; and
a third circuit portion including a first diode-connected transistor coupled between the first output node and a second supply node, and a second diode-connected transistor coupled between the second output node and the second supply node; and
a second circuit including a pair of transistors having gates to receive the second differential signal pair from the output nodes of the first circuit, and to generate digital information based on the second differential signal pair.

10. The apparatus of claim 9, wherein the equalizer circuitry is a decision feedback equalizer circuitry.

11. The apparatus of claim 10, wherein the first circuit includes a summer circuit of the decision feedback equalizer circuitry, and the second circuit includes a sampler circuit.

12. An apparatus comprising:
a first circuit included in an equalizer circuitry and to receive a first differential signal pair and generate a second differential signal pair based on the first differential signal pair, the first circuit including:
a first circuit portion including a first transistor to receive a first signal of the second differential signal pair, and a second transistor to receive a second signal of the second differential signal pair;
a second circuit portion including a third transistor coupled between a first supply node and a first output node to provide a first signal of the second differential pair, and a fourth transistor coupled between the first supply node and a second output node to provide a second signal of the second differential pair, the first transistor including a drain coupled to a source of the third transistor and the first output node, and the second transistor including a drain coupled to a source of the fourth transistor and the second output node;
a third circuit portion including a first diode-connected transistor coupled between the first output node and a second supply node, and a second diode-connected transistor coupled between the second output node and the second supply node, the first and second diode-connected transistors and the third and fourth transistors having a same transistor type, wherein each of the first and second diode-connected transistors, and the third and fourth transistors has a gate coupled to a resistor; and
a second circuit including a pair of transistors having gates to receive the second differential signal pair from the output nodes of the first circuit, and to generate digital information based on the second differential signal pair.

13. The apparatus of claim 12, wherein the transistor type is an n-channel metal-oxide semiconductor (NMOS) transistor type.

14. An apparatus comprising:
conductive lines on a circuit board;
a device located on the circuit board and coupled to the conductive lines; and
a processor located on the circuit board and including a receiver coupled to the conductive lines, the receiver including a circuit, the circuit including:
a first circuit portion including a first transistor to receive a first signal of a differential signal pair provided by the device, and a second transistor to receive a second signal of the differential signal pair;
a second circuit portion coupled to the first and second transistors and a first supply node, the second circuit portion including a first output node and a second output node to provide an output signal pair based on the differential signal pair, wherein the second circuit portion includes:

a first additional transistor coupled between the first supply node and the first output node, the first additional transistor including a gate:
a second additional transistor coupled between the first supply node and the second output node, the second additional transistor including a gate coupled to the gate of the first additional transistor; and
a third circuit portion including a first diode-connected transistor coupled between the first output node and a second supply node, and a second diode-connected transistor coupled between the second output node and the second supply node.

15. The apparatus of claim 14, wherein the receiver includes a decision feedback equalizer, and the circuit is included in the decision feedback equalizer.

16. The apparatus of claim 14, further comprising a connector coupled to the processor, the connector conforming with one of Universal Serial Bus (USB), High-Definition Multimedia Interface (HDMI), Thunderbolt, Peripheral Component Interconnect Express (PCIe), and Ethernet specifications.

* * * * *